United States Patent [19]

Bartur

[11] Patent Number: 5,232,900
[45] Date of Patent: Aug. 3, 1993

[54] SUPERCONDUCTOR STRUCTURE

[75] Inventor: Meir Bartur, Los Angeles, Calif.

[73] Assignee: Superconductor Development Corporation, La Mirada, Calif.

[21] Appl. No.: 205,312

[22] Filed: Jun. 9, 1988

[51] Int. Cl.$^5$ ............................................. B32B 9/00
[52] U.S. Cl. ...................................... 505/1; 505/701; 505/702; 505/704; 421/688; 421/930
[58] Field of Search ............... 505/1, 701, 702, 704; 428/688, 930; 29/599

[56] References Cited

U.S. PATENT DOCUMENTS

| | | | |
|---|---|---|---|
| 4,253,230 | 3/1981 | Davis | 29/580 |
| 4,499,119 | 2/1985 | Smith | 427/63 |
| 4,585,696 | 4/1986 | Dustmann et al. | 428/367 X |

FOREIGN PATENT DOCUMENTS

| | | |
|---|---|---|
| 149181 | 8/1985 | Japan . |
| 208873 | 10/1985 | Japan . |

OTHER PUBLICATIONS

Superconductivity of Serren Printed YBazCuO$_3$ Thick Films on Y$_2$BaCuO$_5$ Substrates, Jap. Journ. Appl. Physics vol. 27 No. 8 Aug. 5, 1988, pp. L1492–L1494.
Naito et al., Journal of Materials Research, vol. 2, No. 6, pp. 713–725 (Nov./Dec., 1987).
Preparation and substrate reactions of superconducting Y-Ba-Cu-O films, M. Gurvitch and A. T. Fiory, Applied Physics Letters, vol. 51, No. 13, Sep. 28, 1987.
Stability of superconducting YBa$_2$Cu$_3$O$_7$ in the prsence of water, R. L. Barns and R. A. Laudise, Applied Physics Letters, vol. 51, No. 17, Oct. 26, 1987.
Chang, Reduced Moisture-induced degradation of Super-Films, Appl. Phys. Lett. 53(12), Sep. 19, 1988, 1113–1115.
Kitagawa, High Te Superconducting Film on Si Sub, gap J. of Appl. Phys., N27(6), Jun. 1988, 1113–1115.
Preparation of Superconducting YBa$_2$Cu$_3$O$_x$ Thin Films by Oxygen Annealing of Multilayer Metal Films, by B. Y. Tsaur et al., Appl. Physics Lett 51(11), Sep. 14, 1987.
Y-Ba-Cu-O Thin Films Prepared by a Multilayer Vacuum Method, by C. X. Qui et al., Appl. Phys. Lett., 52(7), Feb. 15, 1988.
Y-Ba-Cu-O Films Prepared by a Paint-On Method, by I. Shih et al., Appl. Phys. Lett. 52(9), Feb. 29, 1988.
Metallographic Studies of Sintered Y$_1$Ba$_2$Cu$_3$O$_{7-x}$, by J. D. Livingston et al., Tech. Info. Series, G. E. Corp. Research & Devel., No. 87 CRD 263, Dec. 1987.

Primary Examiner—Patrick J. Ryan
Assistant Examiner—Patrick Jowik
Attorney, Agent, or Firm—Spensley Horn Jubas & Lubitz

[57] ABSTRACT

A superconductor structure having a substrate, the substrate defining a surface. Applied to the surface of the substrate is a barrier layer. Applied to the barrier layer is a layer of superconductive material comprising copper and oxygen. The barrier layer serves to prevent the interaction of the superconductive material with the substrate, thus destroying the stoichiometry of the superconductive material and resulting in a loss or decrease in superconductivity. A protective layer is, optionally, applied to the layer of superconductive material.

27 Claims, 1 Drawing Sheet

SUPERCONDUCTOR STRUCTURE

BACKGROUND OF THE INVENTION

The present invention relates to a superconductor structure. Specifically, the present invention relates to a superconductor structure comprising a barrier layer of material between a superconductive material and a substrate.

Superconductors refer to a class of compounds which exhibit a complete disappearance of electrical resistance and repel the magnetic field from the inner volume of the material (Meisner effect) under certain conditions. While various superconductors have been known for a number of years, practical applications for such superconductors have been limited due to a variety of factors. For example, a number of compounds which exhibit superconductivity only exhibit such superconductivity at temperatures near absolute zero. Due to the difficulty of maintaining such low temperatures, the practical applications of such superconductors have been severely limited.

Recently, a massive research effort has been conducted in an attempt to identify compositions exhibiting superconductivity which compositions are capable of exhibiting superconductivity at temperatures significantly above absolute zero.

One type of compound which has been found to exhibit superconductivity at temperatures above absolute zero are certain ceramic compositions comprising copper and oxygen, beneficially comprising copper, oxygen and at least one element selected from the group consisting of bismuth, strontium, calcium, thallium, indium and the rare earth elements and particularly compounds having the general formula:

$$Re_1Ba_2Cu_3O_{7-x}$$

wherein Re represents a rare earth element selected from the group consisting of Er, Gd, Y, Tm, Sm, Eu, Dy, Ho, Yb, Nd, and Lu and $0 \leq x \leq 0.5$. When x is within the described ranges, the oxygen content of the composition is between about 6.5 and 7.0 per unit formula. The ceramic compositions represented by the above described formula exhibit superconductivity at a temperature between 90-100K. While 90-100K is still a very low temperature, maintaining a superconductor at such a temperature is greatly simplified when compared to maintaining a superconductor at or near absolute zero. For example, a temperature of 90-100K can be maintained by employing liquid nitrogen as a coolant. Thus, the ceramic superconducting compounds described above are attractive possibilities in the attempt to adapt superconducting materials for practical applications.

Despite the advantage of demonstrating superconductivity at higher temperatures, the ceramic compositions described above suffer from various other drawbacks. For example, it is known that in order for the described ceramic compositions to exhibit superconductivity, it is important to maintain the stoichiometry of the various elements within very specific ratios, such as those described by the above formula. If the stoichiometry of the compositions is not maintained, the compositions tend to deteriorate and eventually lose their superconductivity.

Additionally, the described ceramic superconductive compositions tend to interact with other materials with which they are in contact. Such interaction between the ceramic superconductive materials and other materials with which they come in contact generally results in the loss of stoichiometry in the materials, thus resulting in the decomposition and eventual loss of superconductivity.

For example, it is often desirable to employ a relatively thin layer of superconductive material in a device. In those instances wherein it is desired to employ a relatively thin layer of superconductive material, it is often necessary to use a substrate as a support for the thin layer of superconductive material.

Unfortunately, it has been discovered that when it is desired to apply a relatively thin layer of superconductive material to a substrate, interaction can occur between the material from which the substrate is formed and the layer of superconductive material. As a result of this interaction, at least a portion of the layer of superconductive material closest to the substrate will lose the stoichiometry desired to impart the superconductivity to the superconductive layer. In effect, and as result of this intraction, a multi-phase layer is formed.

Various attempts have been made to avoid or compensate for the interaction between the substrate and superconductive material layer. For example, it has been suggested that the substrate be selected so that there is a minimum amount of interaction between the substrate layer and the layer of superconductive material. For example, one of the most common substrates employed in the electronics industry is alumina ($Al_2O_3$). Unfortunately, alumina has been found to be relatively reactive with ceramic superconductive materials. Accordingly, it has been proposed that strontium titanate ($SrTiO_3$) be employed as the substrate material. This is because $SrTiO_3$ has been found to be relatively less reactive with the ceramic superconductive materials than alumina and allows for the epitaxial growth of thin films of superconductive materials according to the formula $Y_1Ba_2Cu_3O_{7-x}$.

Unfortunately, $SrTiO_3$ is more expensive and less readily available for use as a substrate and is still somewhat reactive with ceramic superconductive materials. Additionally, $SrTiO_3$ has a very high dielectric constant which limits its use in high frequency applications. Many of the proposed applications for superconductive materials would benefit if it were possible to employ the substrates normally employed with electronic devices in forming superconductor structures.

Moreover, ceramic superconductive materials comprising copper and oxygen have been found to possess relatively poor adhesion to many substrates. For example, when a ceramic superconductive material comprising copper and oxygen is applied to an alumina substrate at a relatively low temperature, the ceramic superconductive layer will often peel off the substrate. When applied at a higher temperature, peeling may be avoided but the higher temperature enhances the deleterious interaction between the substrate and the superconductive layer.

SUMMARY OF THE INVENTION

It is desirable to produce a superconductor structure comprising a substrate and a layer of ceramic superconductive material applied to the substrate, which superconductive material does not lose its stoichiometry due to interaction with the substrate layer and adheres well to the substrate. It is to this goal that the present invention is directed.

In a second aspect, the present invention concerns a method of fabricating a superconductor structure which comprises a substrate and a layer of ceramic superconductive material applied to the substrate which superconductive material is prevented from stoichiometric deterioration due to interaction of the superconductive material with the substrate material. Moreover, it is desirable to be able to form the substrate layer out of substrate materials generally known for use in electronic devices. Specifically, it is desirable to be able to employ substrate materials which, when allowed to come into direct contact with the superconductive material such as those described above, tend to deteriorate the stoichiometry of the superconductive materials and tend not to adhere well to the superconductive materials.

These and other related goals are achieved in a superconductor structure comprising a substrate which defines a surface. Applied to the surface of the substrate is a barrier layer. Applied to the barrier layer is a layer of ceramic superconductive material comprising copper and oxygen. The barrier layer serves the dual function of preventing or substantially reducing the interaction between the substrate material and the layer of superconductive material and of increasing the degree of adhesion between the substrate material and superconductor material layer.

DETAILED DESCRIPTION OF THE PREFERRED EMBODIMENT

In one aspect, the present invention concerns a superconductor structure comprising a superconductive material comprising copper and oxygen, beneficially comprising copper, oxygen and at least one element selected from the group consisting of bismuth, strontium, calcium, thallium, indium and the rare earth elements, and preferably being represented by the formula:

$Re_1Ba_2Cu_3O_{7-x}$ wherein Re represents a rare earth element selected from the group consisting of Er, Gd, Y, Tm, Sm, Eu, Dy, Ho, Yb, Nd, and Lu and $0 \leq x \leq 0.5$, and a substrate layer. The superconductive material is protected from stoichiometric deterioration due to interaction of the superconductive material with the substrate material.

The superconductor structure of the present invention comprises a substrate which defines a surface. Applied to the surface of the substrate is a barrier layer and applied to the barrier layer is a layer of a ceramic superconductive material comprising copper and oxygen, beneficially comprising copper, oxygen and at least one element selected from the group consisting of bismuth, strontium, calcium, thallium, indium and the rare earth elements, and preferably according to the formula:

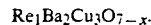

$Re_1Ba_2Cu_3O_{7-x}$.

Figure 1:
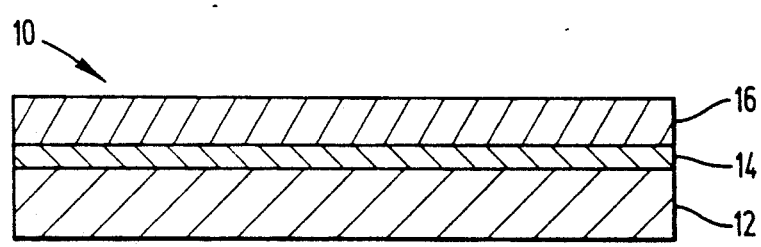
FIG. 1 illustrates a cross-sectional view of a first embodiment of a superconductor structure according to the present invention.

Referring now to FIG. 1, the structure of the present invention is generally represented by the reference numeral 10. The structure comprises a substrate 12 defining a surface on which is applied a barrier layer 14 which in turn has applied thereto a superconductive material layer 16.

Those skilled in the art will appreciate the wide variety of materials suitable for use in forming the substrate of the present invention. As a general rule, materials known to be suitable for use in forming, or being substrates for semiconductor devices are suitable for use in the present invention. Exemplary of materials from which the substrate may be fabricated are alumina, sapphire, boron nitride, berrilium oxide, magnesium oxide, zirconium oxide, strontium titanate and the like. While a relatively wide variety of materials is believed to be suitable for use in forming a subtrate of the present invention, for reasons such as cost, relative ease of availability, standard process technology associated therewith and its extensive use in the semiconductor industry, alumina is the desired material from which to form the substrate.

The substrate generally serves as a support for the ceramic superconductive material layer. Accordingly, the thickness of the substrate may be selected within a fairly wide range. Generally, the substrate will have a thickness of from about 5 mils to about 100 mils, desirably from about 10 mils to about 40 mils. The substrate may have a multilayer construction such as, for example, aluminum oxide coated, via sputtering, on silicon.

Methods of forming the substrate are well known to those skilled in the art. Additionally, while in the illustrated embodiment the substrate is depicted as being generally planar in nature, it is to be understood that the substrate may be formed into a variety of different shapes and sizes. Exemplary of alternative shapes would be wires, spheres and the like.

Applied to the surface of the substrate is a barrier layer. It is believed that the barrier layer of the present invention can be formed from a wide variety of materials. The barrier layer serves to prevent or substantially reduce the degree of interaction between the superconductive material layer and the substrate layer and desirably promotes adhesion between the substrate and superconductive material layer. In effect, the barrier layer should be capable of good adhesion to the substrate as well as good adhesion to the layer of superconductive material.

It has been found that when a composition comprising copper is employed as the ceramic superconductive material and is in direct contact with a substrate, the substrate and superconductive material often interact to deplete the amount of copper present in the superconductive material. Accordingly, the barrier layer desirably comprises copper so that when the barrier layer is allowed to contact the substrate, the substrate interacts with the copper present in a barrier layer. When the superconductive material layer is later applied to the barrier layer, very little interaction between the superconductor material and substrate occurs. Copper is generally present in a barrier material layer in accordance with a preferred embodiment of the present invention in an amount of from about 20 atomic percent to about 80 atomic percent, preferably from about 40 atomic percent to about 60 atomic percent based on total weight of barrier layer material.

It is believed that the barrier layer may comprise a number of different elements in addition to copper. Any element or compound which functions in the described manner is suitable for use in the present invention. Exemplary of the elements which may be combined with copper to form the barrier layer are oxygen, barium, yttrium, lanthanum and mixtures thereof. It has been found that one desirable barrier layer comprises barium and copper, preferably barium, copper and oxygen in the form of barium copper oxide ($BaCuO_2$). A barium copper oxide barrier layer has been found to be particularly well suited for use with ceramic superconductive materials represented by the formula:

$$Re_1Ba_2Cu_3O_{7-x}$$

It is desirable that the barrier layer have a crystal structure similar to the crystal structure of the superconductive material layer. This similarity in crystal structure is desirable because it tends to lessen the interference between the substrate layer and the crystal structure of the superconductive material. Superconductive materials represented by the formula:

$$Re_1Ba_2Cu_3O_{7-x}$$

generally have an orthorhombic perovskite crystal structure. Accordingly, it has been found useful to employ barrier layer materials having a perovskite crystal structure since such a structure is similar to a orthorhombic crystal structure. The barrier layer comprising barium copper oxide has such a crystal structure. Accordingly, other oxides comprising copper and possessing a perovskite crystal structure are believed to be suitable for use in forming the barrier layers according to the present invention.

The barrier layer material of the present invention may be applied directly to the substrate in the barrier layer form or may be formed in a one-step process on the substrate from starting materials known to form the barrier layer material. For example, when barium copper oxide is employed as the barrier layer material, barium copper oxide may be applied directly to the substrate or, alternatively, a mixture of copper oxide (CuO) and barium carbonate ($BaCO_3$) may be formed and applied to the substrate. The substrate coated with the copper oxide and barium carbonate mixture may then be subjected to a heat treatment at a temperature between about 850° C. and about 1100° C. during which the copper oxide and barium carbonate react to form barium copper oxide.

The barrier layer material is suitably applied to the substrate in the form of a paste. The paste is formed by mixing powdered barrier layer material (such as $BaCuO_2$) with a binder material (such as ethyl cellulose) dissolved in a solvent (such as 2-(2-butoxyethoxy)ethanol). Similarly, if the barrier layer material is to be formed in a one-step process, the starting materials (such as CuO and $BaCO_3$) may be applied to the substrate in the form of a paste. The paste is formed from powdered starting materials, a binder (such as ethyl cellulose) and a solvent (such as 2-(2-butoxyethoxy)ethanol). The paste in either instance may be applied to the substrate by painting or by screen printing.

Regardless of whether the barrier layer material is applied directly to the substrate or is formed in a one-step process on the substrate, it is preferable that the barrier layer material be subsequently exposed to a heat treatment step wherein the barrier layer material is heated above its melting point. This causes the barrier material to liquify and flow over the surface of the substrate. Since a relatively thin layer of barrier material may be employed in the structures of the present invention, it is generally desirable that the barrier layer be formed from a material which "wets" the surface of the substrate material. By the term "wets", it is meant that the surface tension between the surface of the substrate and the barrier layer, in a molten state, is very low. This allows for the easy formation of a thin layer of barrier layer material. In the case where the barrier layer is formed in a one-step process, this heat treatment beneficially occurs as part of the process in which, for example, $BaCO_3$ and CuO are converted to $BaCuO_2$.

The ratio of barium to copper in the barrier layer comprising barium copper oxide may vary from about 1:20 to 1:0.5. The ratio of barium to copper is beneficially from about 1:13 to about 1:1. The exact ratios of the various elements making up the barrier layer material will vary depending on the composition of the substrate material and the interaction between substrate and superconductive material layers.

The barrier layer is preferably thick enough to prevent an undesirable degree of interaction between the substrate and the superconductive material layer. As a general rule, the thickness of the barrier layer is suitably from about 0.1 $\mu$m to about 200 $\mu$m, beneficially from about 5 $\mu$m to about 80 $\mu$m, and preferably from about 10 $\mu$m to about 40 $\mu$m.

The superconductive material used to form layer 16 in FIG. 1 comprises copper and oxygen, beneficially copper, oxygen and at least one element selected from the group consisting of bismuth, strontium, calcium, thallium, indium, and the rare earth elements, and is preferably represented by the formula:

$$Re_1Ba_2Cu_3O_{7-x}$$

wherein Re is a rare earth element selected from a group consisting of Er, Gd, Y, Tm, Sm, Eu, Dy, Ho, Yd, Nd, and Lu and $0 \leq x \leq 0.5$. Compositions according to the above described formula are known to those skilled in the art. In one embodiment to the present invention, Re is selected from the group consisting of Y, Er, and Gd. Methods of fabricating the superconductive materials represented by the above described formula are known to those skilled in the art. The method by which the superconductive material is formed is not believed to be critical to the present invention. Accordingly, any method of production is suitable to form the superconductive materials for use in the present invention.

The layer 16 of superconductive material suitably has a thickness of from about 0.1 $\mu$m to about 200 $\mu$m. Applicant has found that it is often more simple to obtain the proper stoichiometry when the layer of superconductive material is relatively thick. As used herein, a layer of superconductive material which is relatively thick will generally have a thickness of from about 5.0 $\mu$m to about 100 $\mu$m, preferably from about 10 $\mu$m to about 80 $\mu$m.

Methods of applying the layer of superconductive material to the substrate are known to those skilled in the art. As a general rule, one of two methods will be employed. First, it is possible to form a powder of the superconductive material having the above described composition. This powder is then mixed with a binder to form a resultant paste. The binder generally comprises a material capable of binding the particles together, said material being dissolved in a solvent. Exemplary of a suitable binder is ethyl cellulose in a solvent (such as 2-(2-butoxyethoxy)ethanol). The resultant paste is applied to the substrate to a desired thickness. The substrate and paste of superconductive material can then be fired at temperatures between about 800° C. and about 1100° C. to burn off the binder and solvent thus leaving a layer of superconductive material.

Alternatively, applicant has discovered that it is possible to form the superconductive material in a onestep process from a paste-like material. That is, rather than employ a powder of a superconductive material, it is possible to form a paste comprising the oxides and carbonates known to form the superconductive materials of the present invention. These oxides and carbonates are mixed with a binder (such as ethyl cellulose) and a solvent (such as 2-(2-butoxyethoxy)ethanol). The resultant paste-like mixture can then be applied to the substrate. The substrate and described paste-like mixture are then subjected to a firing process similar to the firing process normally employed in forming superconductive materials of the formula:

$Re_1Ba_2Cu_3O_{7-x}$

In this manner, the binder and solvent are driven off and the superconductive layer can be formed in what is essentially a one-step process.

Nonetheless, while forming the superconductive material in a one-step process may represent some economic advantages, it is not believed critical to the present invention. Moreover, any thin or thick film deposition methodology, as well as bulk technology, is believed to be appropriate for use in the current invention. For example, the superconductive material layer may be formed by molecular beam epitaxy, sputtering, reactive evaporations and the like. When such methods are used, relatively thin layers are generally formed (0.2 $\mu$m–2.0 $\mu$m).

The superconductive materials described above are known to be capable of interaction with water, water vapor, carbon dioxide and the like. Accordingly, while the barrier layer described above prevents interaction between the substrate and the superconductive material layer, it is possible for the superconductive materials to lose their stoichiometry due to interaction of the superconductive materials with water, air, water vapor, carbon dioxide and the like. Accordingly, it is desirable to protect the superconductive materials from exposure to water, air, water vapor, carbon dioxide and the like. A method suitable for protecting the superconductive materials from loss of stoichiometry due to exposure to water, air, water vapor, carbon dioxide and the like is disclosed in co-pending U.S. patent application Ser. No. 07/544,021, filed Jun. 25, 1990, which is a file wrapper continuation of Ser. No. 198,735, filed Jun. 9, 1988 (on even date with this application) now abandoned for SUPERCONDUCTOR STRUCTURE by Meir Bartur which application is incorporated herein by reference. As set forth in the referenced U.S. patent application, it is possible to form a protective layer on the superconductive material. The protective layer is intended to protect the superconductive material from exposure to water, air, water vapor, carbon dioxide and the like and thus prevent loss of stoichiometry and the resultant loss of superconductivity.

Any material capable of performing the above functions and of being applied to the superconductive material and which is compatible with said superconductive material (producing no loss of stoichiometry or otherwise deliteriously affecting the superconductive material) is suitable for use in the present invention. Exemplary of the materials from which the protective material layer may be formed are silicon dioxide ($SiO_2$) and silicon nitride ($Si_3N_4$). These materials are preferred due to the ready availability of deposition methodology and equipment for their use, ease of deposition, ability to perform the described function and relative inertness to the superconductive materials at low temperatures.

A variety of methods are suitable for use in applying the protective layer to the superconductive material. However, elevating the superconductive materials to temperatures in excess of about 250° C. can result in the evolution of oxygen by the superconductive material and the resultant loss or decrease in superconductivity. Accordingly, it is desirable to employ a method which does not deliteriously affect the superconductive material layer.

Exemplary of the methods suitable for use in applying the protective layer to the superconductive material is the low pressure, plasma enhanced chemical vapor deposition process (LPPECVD). Those skilled in the art will recognize what is meant by a low pressure, plasma enhanced chemical vapor deposition process. Such a process is desirable for use in the present invention because it allows the protective material layer to be applied at relatively low temperatures, typically in the range of from about 20° C. to about 450° C. Additionally, the LPPECVD process causes ions having a relatively low energy level to impinge upon the surface of the superconductive material layer. Thus, the interaction and loss of stoichiometry in the superconductive material is less likely to occur when the LPPECVD process is employed.

It is believed that a relatively thin layer of the protective material will prevent loss of stoichiometry during subsequent deposition of additional protective layer material. Therefore, it may be possible to employ an LPPECVD method in conjunction with a different method, such as RF sputtering to form the layer of protective material. In such an instance, the initial thickness of protective layer material would be applied through a LPPECVD process with additional amounts of the protective layer material being applied through an RF sputtering process. Typically, the layer of protective material will have a thickness capable of performing the above described protective function. Generally, the layer of protective material will have a thickness of from about 100 Angstroms to about 26 $\mu$m, beneficially from about 1000 Angstroms to about 10 $\mu$m and preferably from about 1000 Angstroms to about 10,000 Angstroms. The exact thickness of the protective layer of material will depend, to an extent, on the material from which the protective layer is formed, the roughness of the superconductive material and the environment in which the device of the present invention is to be used.

Figure 2:
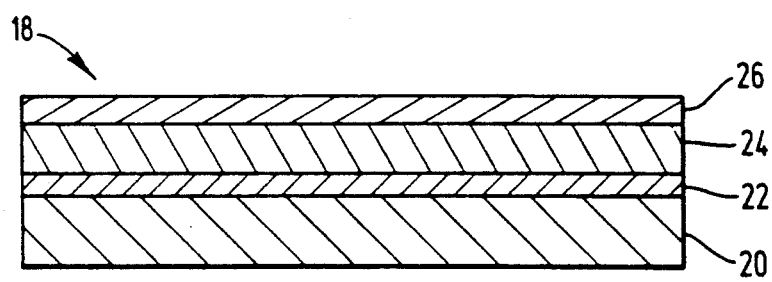
FIG. 2 illustrates a cross-sectional view of a second embodiment of a superconductor structure according to the present invention.

FIG. 2 illustrates a cross-section of a second embodiment of the present invention. The structure of the present invention is generally represented by the numeral 18. The structure 18 comprises substrate 20, barrier layer 22, superconductive material layer 24, and protective layer 26. In this embodiment of the present invention, the superconductive material is prevented from loss of stoichiometry by both interaction of the superconductive material with the substrate or by interaction of the superconductive material with water, air, water vapor, carbon dioxide and the like.

It is anticipated that in certain applications wherein the substrate is particularly reactive towards the layer of superconductive material, that it may be desirable to employ a second diffusion barrier layer between the substrate and the layer of ceramic superconductive material. For example, in known semiconductor technology, when silicon is employed as a substrate, it is known to employ a diffusion barrier such as TiW, W, WN, TiN, or Cr. These diffusion barriers would aid in preventing the diffusion of copper out of the layer of superconductive material. In those instances, when a further diffusion barrier is desired, the diffusion barrier would be evaporated onto the substrate according to known technology to a thickness of from about 500 Angstroms to about 2000 Angstroms. The barrier layer material would then be applied to the first diffusion barrier as herein before described. Similarly, the layer of ceramic superconductor material and, optionally, the protective material layer would be applied as hereinbefore described.

EXAMPLES

Example 1

A structure according to the present invention is formed in the following manner.

A substrate of alumina (96% density) is provided. The substrate is in the form of a rectangle one inch by two inches having a thickness of approximately 20 mils.

The material from which a barrier material layer is to be formed is prepared as follows.

A fine powder of copper oxide (CuO) and barium carbonate ($BaCO_3$) is prepared by grinding. The powders are mixed in appropriate ratios to form a resultant powder mixture wherein the Ba:Cu atomic ratio is within the range of from about 1:13 to about 1:0.4. To the resultant powder mixture is then added about 15 to about 40 weight percent, based on total mixture weight, a binder comprising ethyl cellulose and 2-(2-butoxyethoxy)ethanol (6 g/100 cc) to form a paste.

The paste is then applied to one side of the substrate via painting to a thickness of about 60 $\mu$m. The substrate is then dried by heating to about 125°-150° C. to drive off the 2-(2-butoxyethoxy)ethanol. Following the drying process, the substrate is subjected to a heat treatment.

The heat treatment is conducted in an open quartz tube furnace, four inches in diameter. The quartz tube furnace is held at a temperature of about 525° C. in a flowing oxygen atmosphere. After about 20 minutes, the temperature is gradually ramped up to between 750° C. and 1100° C. for approximately two hours. The substrate is then slowly cooled to room temperature.

The material from which a superconductive material layer is to be formed is prepared as follows.

An intimate admixture of $Y_2O_3$, $BaCO_3$ and CuO appropriate to form a composition according to the unit formula $Y_1Ba_2Cu_3O_{7-x}$ is formed. The mixture is suitably formed by mixing and grinding in a ball mill or mortar and pestle. To the mixture is then added about 15 to about 40 weight percent, based on total mixture weight, of a binder comprising ethyl cellulose and 2-(2-butoxyethoxy)ethanol (6 g/100 cc) to form a paste.

The paste is then applied to the barrier layer via painting to a thickness of about 80 $\mu$m. The structure is then dried by heating to about 125°-150° C. to drive off the 2-(2-butoxyethoxy)ethanol. Following the drying process, the coated substrate is loaded into an open quartz tube furnace held at a temperature of about 525° C. in an $O_2$ and $N_2$ (10/5) atmosphere. After about 20 minutes, the temperature is gradually ramped up to between 875° C. and 975° C. The substrate is held at this temperature for 2-20 hours. Then, the substrate is slowly cooled to about 500° C. and held in an $O_2$ atmosphere for 1-24 hours. The substrate is then slowly cooled to room temperature.

In this manner, a structure such as that illustrated in FIG. 1 is produced.

Example 2

A structure according to FIG. 2 of the instant invention is produced in the following manner.

The structure as described in Example 1 comprising a substrate, a barrier layer, and a superconductive material layer is formed as set forth in Example 1. To the structure of Example 1 is then applied a protective material layer in the following manner.

The structure of Example 1 is placed in a standard low pressure plasma enhanced chemical vapor deposition chamber. The substrate is held at room temperature. The deposition chamber is evacuated over a period of about 1-3 minutes to about 100-300 $\mu$ torr. A gas mixture of $SiH_4$ and $NO_2$ or $NH_3$ (1:1-40:1) is fed into the deposition chamber. The pressure in the chamber is controlled at about 150-800 $\mu$ torr. RF power is applied for about 1-30 minutes. When a mixture of $SiH_4$ and $NO_2$ is employed, $SiO_2$ is deposited. When a mixture of $SiH_4$ and $NH_3$ is employed, $Si_3N_4$ is deposited. The deposited layer will have a thickness of from about 500 to about 10,000 Angstroms depending on deposition time.

As is apparent from the foregoing specification, including the examples, the present invention is capable of being embodied with various alterations and modifications from those described above. For this reason, it is to be fully understood that all of the foregoing is intended to be merely illustrative and is not intended to limit, in any manner, the scope of the invention as set forth in the following claims.

What is claimed is:

1. A superconductor structure comprising:
    a substrate defining a surface;
    a barrier layer of about 0.1-200 $\mu$m thickness applied to the surface of the substrate, the barrier layer comprising copper and oxygen and an element selected from the group consisting of Ba, Y and La and mixtures thereof and having a perovskite crystal structure; and
    a layer of a ceramic superconductive material applied to the barrier layer, comprising a composition represented by the formula:

    $Re_1Ba_2Cu_3O_{7-x}$ wherein Re is a rare earth element selected from the group consisting of Er, Gd, Y, Tm, Sm, Eu, Dy, Ho, Yb, Nb and Lu and $0 \leq x \leq 0.5$;
    said barrier layer reducing interaction, but increasing adhesion, between the substrate and the layer of ceramic superconductive material.

2. A structure according to claim 1 wherein the barrier layer comprises barium copper oxide ($BaCuO_2$) having a barium to copper ratio of about 1:13 to about 1:1.

3. A superconductor structure according to claim 1, wherein the barrier layer comprises barium copper oxide (BaCuO$_2$) having a barium to copper ratio of about 1:20 to 1:0.5.

4. A superconductor structure comprising:
a substrate defining a surface;
a barrier layer comprising copper and oxygen and an element selected from the group consisting of Ba, Y and La and mixtures thereof, of about 10 μm to about 40 μm thickness applied to the surface of the substrate; and
a layer of a ceramic superconductive material applied to the barrier layer, comprising a composition represented by the formula:

$$Re_1Ba_2Cu_3O_{7-x}$$

wherein Re is a rare earth element selected from the group consisting of Er, Gd, Y, Tm, Sm, Eu, Dy, Ho, Yb, Nb and Lu and $0 \leq x \leq 0.5$;
said barrier layer reducing interaction, but increasing adhesion, between the substrate and the layer of ceramic superconductive material.

5. A superconductive structure comprising:
a substrate defining a surface;
a barrier layer comprising copper and oxygen and an element selected from the group consisting of Ba, Y and La and mixtures thereof, of about 0.1-200 μm thickness applied to the surface of the substrate; and
a layer of a ceramic superconductive material having a thickness of from about 0.1 μm to about 200 μm applied to the barrier layer, comprising a composition represented by the formula:

$$Re_1Ba_2Cu_3O_{7-x}$$

wherein Re is a rare earth element selected from the group consisting of Er, Gd, Y, Tm, Sm, Eu, Dy, Ho, Yb, Nb and Lu and $0 \leq x \leq 0.5$;
said barrier layer reducing interaction, but increasing adhesion, between the substrate and the layer of ceramic superconductive material.

6. The structure according to claim 5 wherein the layer of superconductive material has a thickness of from about 10 μm to about 80 μm.

7. The structure according to claim 1, further comprising: a protective layer selected from the group consisting of silicon dioxide and silicon nitride applied to the surface of the superconductive material.

8. A superconductor structure, the superconductor structure comprising:
an alumina substrate defining a surface;
a barrier layer comprising copper and oxygen and an element selected from the group consisting of Ba, Y and La and mixtures thereof, having a perovskite crystal structure, of about 0.1-200 μm thickness applied to the surface of the alumina substrate; and
a layer of ceramic superconductive material applied to the barrier layer, comprising a composition represented by the formula:

$$Re_1Ba_2Cu_3O_{7-x}$$

wherein Re is a rare earth element selected from the group consisting of Er, Gd, Y, Tm, Sm, Eu, Dy, Ho, Yb, Md, and Lu and $0 \leq x \leq 0.5$.

9. The structure according to claim 8 further comprising a protective layer selected from the group consisting of silicon dioxide and silicon nitride applied to the surface of the superconductive material.

10. The structure according to claim 3, further comprising: a protective layer selected from the group consisting of silicon dioxide and silicon nitride applied to the surface of the superconductive material.

11. The structure according to claim 4, further comprising: a protective layer selected from the group consisting of silicon dioxide and silicon nitride applied to the surface of the superconductive material.

12. The structure according to claim 5, further comprising: a protective layer selected from the group consisting of silicon dioxide and silicon nitride applied to the surface of the superconductive material.

13. The structure according to claim 12 wherein the layer of superconductive material has a thickness of from about 10 μm to about 80 μm.

14. The structure of claim 3 wherein the substrate comprises alumina.

15. The structure of claim 4 wherein the substrate comprises alumina.

16. The structure of claim 5 wherein the substrate comprises alumina.

17. The structure of claim 7 wherein the substrate comprises alumina.

18. The structure of claim 10 wherein the substrate comprises alumina.

19. The structure of claim 11 wherein the substrate comprises alumina.

20. The structure of claim 12 wherein the substrate comprises alumina.

21. A superconductor structure comprising:
a substrate defining a surface;
a barrier layer applied to the surface of the substrate, the barrier layer comprising BaCuO$_2$; and
a layer of a ceramic superconductive material applied to the barrier layer, comprising a composition represented by the formula:

$$Re_1Ba_2Cu_3O_{7-x}$$

wherein Re is a rare earth element selected from the group consisting of Er, Gd, Y, Tm, Sm, Eu, Dy, Ho, Yb, Nb and Lu and $0 \leq x \leq 0.5$.

22. A superconductor structure comprising:
a substrate, comprising alumina, defining a surface;
a barrier layer comprising BaCuO$_2$ having a barium to copper ratio from about 1:13 to about 1:1 and of about 10 μm to about 40 μm thickness applied to the surface of the substrate; and
a layer of a ceramic superconductive material applied to the barrier layer, comprising a composition represented by the formula:

$$Re_1Ba_2Cu_3O_{7-x}$$

wherein Re is a rare earth element selected from the group consisting of Er, Gd, Y, Tm, Sm, Eu, Dy, Ho Yb, Nb and Lu and $0 \leq x \leq 0.5$,
said barrier layer reducing interaction, but increasing adhesion, between the substrate and the layer of ceramic superconductive material.

23. A superconductive structure comprising:
a substrate defining a surface;
a barrier layer comprising copper and oxygen of about 0.1-200 μm thickness applied to the surface of the substrate; and a layer of a ceramic superconductive material having a thickness of from about 0.1 μm to about 200 μm applied to the barrier layer, comprising a composition represented by the formula:

$$Re_1Ba_2Cu_3O_{7-x}$$

wherein Re is a rare earth element selected from the group consisting of Er, Gd, Y, Tm, Sm, Eu, Dy, Ho Yb, Nb and Lu and $0 \leq x \leq 0.5$, said barrier layer reducing interaction, but increasing adhesion, between the substrate and the layer of ceramic superconductive material.

24. A superconductor structure according to claim 23, the substrate comprising alumina.

25. A superconductor structure comprising:
a substrate defining a surface;
a barrier layer comprising copper and oxygen of about 0.1-200 μm thickness applied to the surface of the substrate;
a layer of a ceramic superconductive material applied to the barrier layer, comprising a composition represented by the formula:

$$Re_1Ba_2Cu_3O_{7-x}$$

wherein Re is a rare earth element selected from the group consisting of Er, Gd, Y, Tm, Sm, Eu, Dy, Ho Yb, Nb and Lu and $0 \leq x \leq 0.5$, said barrier layer reducing interaction, but increasing adhesion, between the substrate and the layer of ceramic superconductive material; and
a protective layer selected from the group consisting of silicon dioxide and silicon nitride, applied to the surface of the superconductive material.

26. The superconductor structure according to claim 22, further comprising: a protective layer selected from the group consisting to silicon dioxide and silicon nitride applied to the surface of the superconductive material.

27. A superconductor structure according to claim 25, the substrate comprising alumina.

* * * * *